(12) United States Patent
Rozman et al.

(10) Patent No.: US 8,625,243 B2
(45) Date of Patent: Jan. 7, 2014

(54) MULTI-FUNCTIONAL SOLID STATE POWER CONTROLLER

(75) Inventors: Gregory I. Rozman, Rockford, IL (US); Steven J. Moss, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 54 days.

(21) Appl. No.: 13/218,151

(22) Filed: Aug. 25, 2011

(65) Prior Publication Data

US 2013/0050890 A1 Feb. 28, 2013

(51) Int. Cl.
*H02H 3/20* (2006.01)
*H02H 3/24* (2006.01)

(52) U.S. Cl.
USPC .......................................................... 361/90

(58) Field of Classification Search
USPC .......................................................... 361/90
See application file for complete search history.

(56) References Cited

U.S. PATENT DOCUMENTS

| | | | |
|---|---|---|---|
| 4,093,900 A | 6/1978 | Plunkett | |
| 4,119,861 A | 10/1978 | Gocho | |
| 4,420,784 A | 12/1983 | Chen et al. | |
| 4,638,175 A | 1/1987 | Bradford et al. | |
| 5,132,894 A | 7/1992 | Rozman et al. | |
| 5,291,143 A | 3/1994 | Cronauer | |
| 5,350,997 A | 9/1994 | Ghotbi et al. | |
| 5,422,517 A | 6/1995 | Verney et al. | |
| 5,455,731 A | 10/1995 | Parkinson | |
| 5,495,155 A | 2/1996 | Juzswik et al. | |
| 5,526,347 A | 6/1996 | Chen et al. | |
| 5,752,047 A | 5/1998 | Darty et al. | |
| 6,072,673 A | 6/2000 | Chen et al. | |
| 6,154,379 A | 11/2000 | Okita | |
| 6,577,138 B2 | 6/2003 | Zuercher et al. | |
| 6,643,112 B1 | 11/2003 | Carton et al. | |
| 7,315,774 B2 | 1/2008 | Morris | |
| 7,453,680 B2 * | 11/2008 | Hallak et al. | 361/93.9 |
| 7,564,147 B2 | 7/2009 | Michalko | |
| 7,595,613 B2 | 9/2009 | Thompson et al. | |
| 7,741,883 B2 | 6/2010 | Fuller et al. | |
| 7,830,071 B2 | 11/2010 | Abramovich et al. | |
| 7,847,429 B2 * | 12/2010 | Miyama et al. | 307/9.1 |
| 7,952,225 B2 * | 5/2011 | Reichard et al. | 307/10.1 |
| 2004/0156154 A1 | 8/2004 | Lazarovich et al. | |
| 2004/0238243 A1 | 12/2004 | King et al. | |
| 2006/0103358 A1 | 5/2006 | Schulte et al. | |
| 2007/0029986 A1 | 2/2007 | Nakamura et al. | |

(Continued)

FOREIGN PATENT DOCUMENTS

| | | |
|---|---|---|
| DE | 19607669 A1 | 9/1997 |
| EP | 1921531 A1 | 5/2008 |

OTHER PUBLICATIONS

European International Search Report dated Dec. 20, 2012 for Application No. 12181229.1-1233.

(Continued)

*Primary Examiner* — Dharti Patel
(74) *Attorney, Agent, or Firm* — Cantor Colburn LLP

(57) ABSTRACT

A solid state power controller apparatus can include an on/off-current limit controller, a pre-charge controller coupled to the on/off-current limit controller, an active damper controller coupled to the on/off-current limit controller and a main switch coupled to and responsive to on/off and protective commands from the on/off-current limit controller.

17 Claims, 2 Drawing Sheets

(56) References Cited

U.S. PATENT DOCUMENTS

| | | |
|---|---|---|
| 2008/0106152 A1 | 5/2008 | Maier |
| 2008/0143462 A1 | 6/2008 | Belisle et al. |
| 2009/0295341 A1 | 12/2009 | Nakamura et al. |
| 2009/0314179 A1 | 12/2009 | Kumar |
| 2010/0254046 A1 | 10/2010 | Liu et al. |
| 2011/0100735 A1 | 5/2011 | Flett |

OTHER PUBLICATIONS

European Search Report dated May 10, 2013 for Application No. 12181283.8-1503.

European Search Report dated May 10, 2013 for Application No. 12181417.2-1503.

* cited by examiner

MULTI-FUNCTIONAL SOLID STATE POWER CONTROLLER

BACKGROUND OF THE INVENTION

The subject matter disclosed herein relates to electric power generation and distribution, and more particularly to a multi-functional solid state power controller for electric power generation and distribution systems.

Electrical power systems in hybrid vehicles, such as military hybrid vehicles, can include high voltage direct current (DC) power generation and distribution. Solid State Power Controllers (SSPC) can be used in a power distribution system to replace traditional electromechanical circuit breakers. The main functions of the SSPC can include power distribution and protection of power to different loads. In comparison to electromechanical devices, SSPC provides fast response time, and eliminates arcing during turn-off transient and bouncing during turn-on transient. SSPC does not suffer severe degradation during repeated fault isolation in comparison with electromechanical devices. SSPC facilitates advanced protection and diagnostics, and provides more efficient power distribution architectures and packaging techniques, due to the smaller size and weight of SSPC. However, current SSPC typically lack system oriented function and have system integration issues.

BRIEF DESCRIPTION OF THE INVENTION

Exemplary embodiments include a solid state power controller apparatus, including an on/off-current limit controller, a pre-charge controller coupled to the on/off-current limit controller, an active damper controller coupled to the on/off-current limit controller and a main switch coupled to and responsive to on/off and protective commands from the on/off-current limit controller.

Additional exemplary embodiments include a solid state power controller system, including solid state power controller apparatus, having an on/off-current limit controller, a pre-charge controller coupled to the on/off-current limit controller, an active damper controller coupled to the on/off-current limit controller and a main switch coupled to and responsive to on/off and protective commands from the on/off-current limit controller. The solid state power controller system can further include a direct current power source coupled to the solid state power controller apparatus, a constant power load and an input filter disposed between the constant power load and the SSPC apparatus.

Further exemplary embodiments include solid state power controller protective function method, including in response to an over current condition, turning off a main switch and turning on a first auxiliary switch to prevent pulse width modulation of the main switch and to direct current to a current limiting resistor and in response to a condition including at least one of over/under voltage, excessive ripple current, repetitive low over-current and harmful temperatures turning off a main switch and generating an alert.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
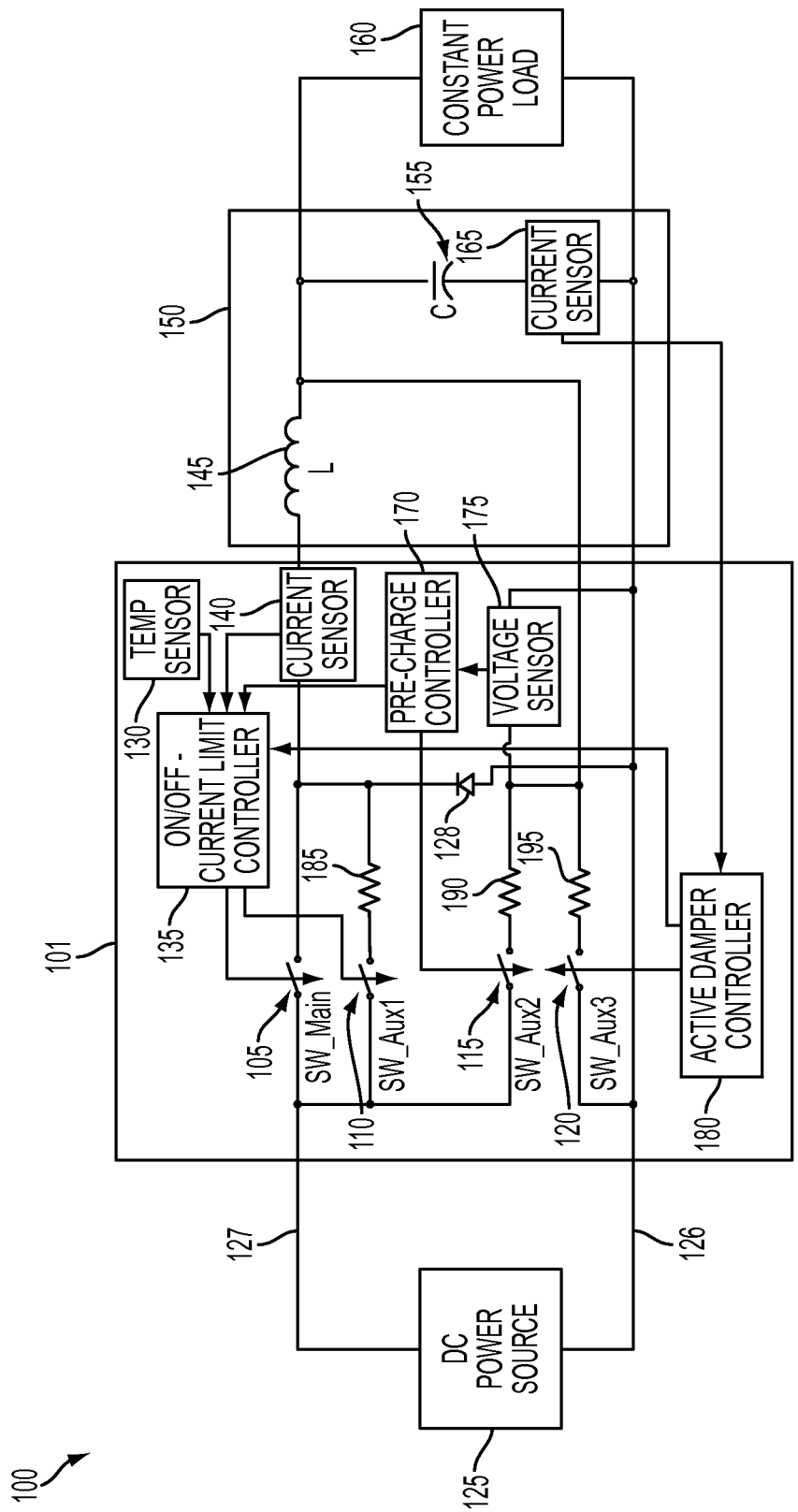
FIG. 1 illustrates an exemplary multi-functional SSPC.

FIG. 1 illustrates a multi-functional SSPC system 100 according to one embodiment. In one or more embodiments and as further discussed below, the system 100 may improve system stability in the presence of constant power (i.e., negative impedance) loads, eliminate pre-charge circuits from the switching mode power converter due to synergism with the main SSPC switch, and/or avoid over sizing current rating of the main switch to meet short circuit conditions.

In one embodiment, the system 100 can include a DC power source 125 electrically coupled to an SSPC 101. In one embodiment, the DC source 125 can be an AC generator whose output is rectified to a DC voltage that includes voltage ripples, or any other DC input that can include ripples. The DC power source includes a positive rail 127 and a negative rail 126. The system 100 can further include an input filter 150 electrically coupled to the SSPC 101, and further electrically coupled to a constant power load 160. In one embodiment, the input filter 150 can be an LC filter having an inductor 145 and a capacitor 155 having values selected to filter out certain frequencies between the SSPC 101 and the constant power load 160. As known in the art, the LC filter is tuned to include minimal damping with as low a resistance as possible. The capacitor 155 is electrically coupled to a filter current sensor 165 described further herein.

The SSPC 101 includes a main switch 105 sized to meet low conduction losses in the SSPC 101. The SSPC 101 further includes first, second and third auxiliary switches 110, 115, 120 electrically coupled to the main switch 105. The first, second and third auxiliary switches 110, 115, 120 and the main switch 105 are further electrically coupled to the DC power source 125. The SSPC 101 further includes an on/off-current limit controller coupled to the main switch 105 and the first auxiliary switch 110. The SSPC 101 also includes a temperature sensor 130 that is electrically coupled to the on/off-current limit controller 135. The SSPC 101 further includes an SSPC current sensor 140 that is electrically coupled to the on/off-current limit controller 135 and the main switch 105. The SSPC current sensor 140 is also electrically coupled to the inductor 145 in the input filter 150.

The SSPC 101 furthers include a pre-charge controller 170 that is electrically coupled to the on/off-current limit controller 135 and to the second auxiliary switch 115. As further described herein, the pre-charge controller 170 limits in-rush current of capacitive loads (part of constant power load). The SSPC 101 further includes a voltage sensor 175 that is electrically coupled to the pre-charge controller 170 and to the negative rail 126. The SSPC 101 further includes an active damper controller 180 that is electrically coupled to the on/off-current limit controller 135, the filter current sensor 165 and the third auxiliary switch 120.

The SSPC 101 further includes a current limiting resistor 185, a pre-charge resistor 190 and a damping resistor 195. The current limiting resistor 185 is electrically coupled to the first auxiliary switch 110 and an overvoltage protection diode 128 that bridges the negative rail 126 and a positive rail 127 of the DC power source 125. The overvoltage protection diode 128 prevents overvoltage during the switching operations described herein. The pre-charge resistor 190 coupled to the second auxiliary switch 115 and the voltage sensor 175. The damping resistor 195 coupled to the third auxiliary switch and to the input filter 150.

In one embodiment, the main switch 105 is responsive to on/off commands and protective functions from the on/off-current limit controller 135. The protective functions are generated by the on/off-current limit controller 135 in response to conditions including, but not limited to: module over-temperature; over-current; repetitive low over current; over/under voltage conditions; and excessive ripple.

In one embodiment, the first auxiliary switch 110 is sized to sustain over-current conditions for a limited time. The first auxiliary switch 110 avoids pulse width modulation of the main switch 105 during overload conditions. The current limiting resistor 185 limits the current at the main switch 105 during the overload conditions. During over current conditions, the SSPC current sensor 140 detects the over current conditions and signals the on/off-current limit controller 135 of the over current conditions. In response to the over current conditions, the on/off-current limit controller 135 turns off the main switch 105 and keeps the first auxiliary switch 110 on thereby limiting the over current in the limiting resistor 185. If the SSPC current sensor 140 falsely detects the over current condition, the on/off-current limit controller 135 turns on the main switch 105. If the SSPC current sensor 140 properly detected the over current condition, the on/off-current limit controller 135 turns off the first auxiliary switch 110 as well and generates an indication of an over current fault as part of the over current protective function.

In one embodiment, the pre-charge controller 170 enables a soft start of capacitive loads (e.g., from the constant power load 160) and controls the low current second auxiliary switch 115. As such, the pre-charge controller 170 turns on the second auxiliary switch during power up of the system 100. When the voltage sensor 175 detects the low voltage of the system 100 during power-up, the voltage sensor 175 can signal the pre-charge controller 170. In response to the low voltage of the system power up, the pre-charge controller 170 can turn the second auxiliary switch 115 on. When the voltage sensor 175 senses that the system 100 has reached a predetermined voltage level, the voltage sensor 175 can signal the pre-charge controller 170 that the predetermined voltage level has been met. In response to the predetermined voltage level being met, the pre-charge controller 170 can open the second auxiliary switch 115. The pre-charge controller 170 also detects over/under voltage conditions measured by the voltage sensor 175 and commands the main switch 105 to turn-off if the operating voltage is outside of specified limits. In addition, when the second auxiliary switch 115 is switched on, pre-charge resistor 190 limits the current through it for a controlled rise time of the system voltage during power up.

In one embodiment, the active damper controller 180 improves system stability by connecting, for a short time, the damping resistor 195 to the negative rail 126 of the DC power source 125. The active damping is responsive to the capacitor 155 current of the input filter 150 as sensed by the filter current sensor 165. If the filter current sensor 165 detects that the capacitor current exceeds a predetermined level, the filter current sensor 165 signals the active damper controller 180. In response to the excess current, the active damper controller 180 turns on the third auxiliary switch 120 thereby connecting the damping resistor 195 to the negative rail 126. When the filter current sensor 165 detects that the capacitor 155 current has crossed zero, the filter current sensor 165 signals the active damper controller 180. In response to the capacitor 155 current crossing zero, the active damper controller turns off the third auxiliary switch 120. The operation of active damping improves system stability in the presence of constant power loads.

As described herein, the on/off-current limit controller 135 provides protective functions to the main switch 105. The current limiting protective function is described above. In addition, the on/off-current limit controller 135 can provide a protective function and/or turn off the main switch 105 if the temperature sensor 130 detects conditions that could damage the main switch 105. In addition, the on/off-current limit controller 135 can provide a protective function and/or turn off the main switch to the main switch 105 responsive to repetitive low over current conditions detected by the SSPC current sensor 140, or over/under voltage conditions detected by the voltage sensor 175 or excessive current ripple conditions detected by the SSPC current sensor 140.

Figure 2:
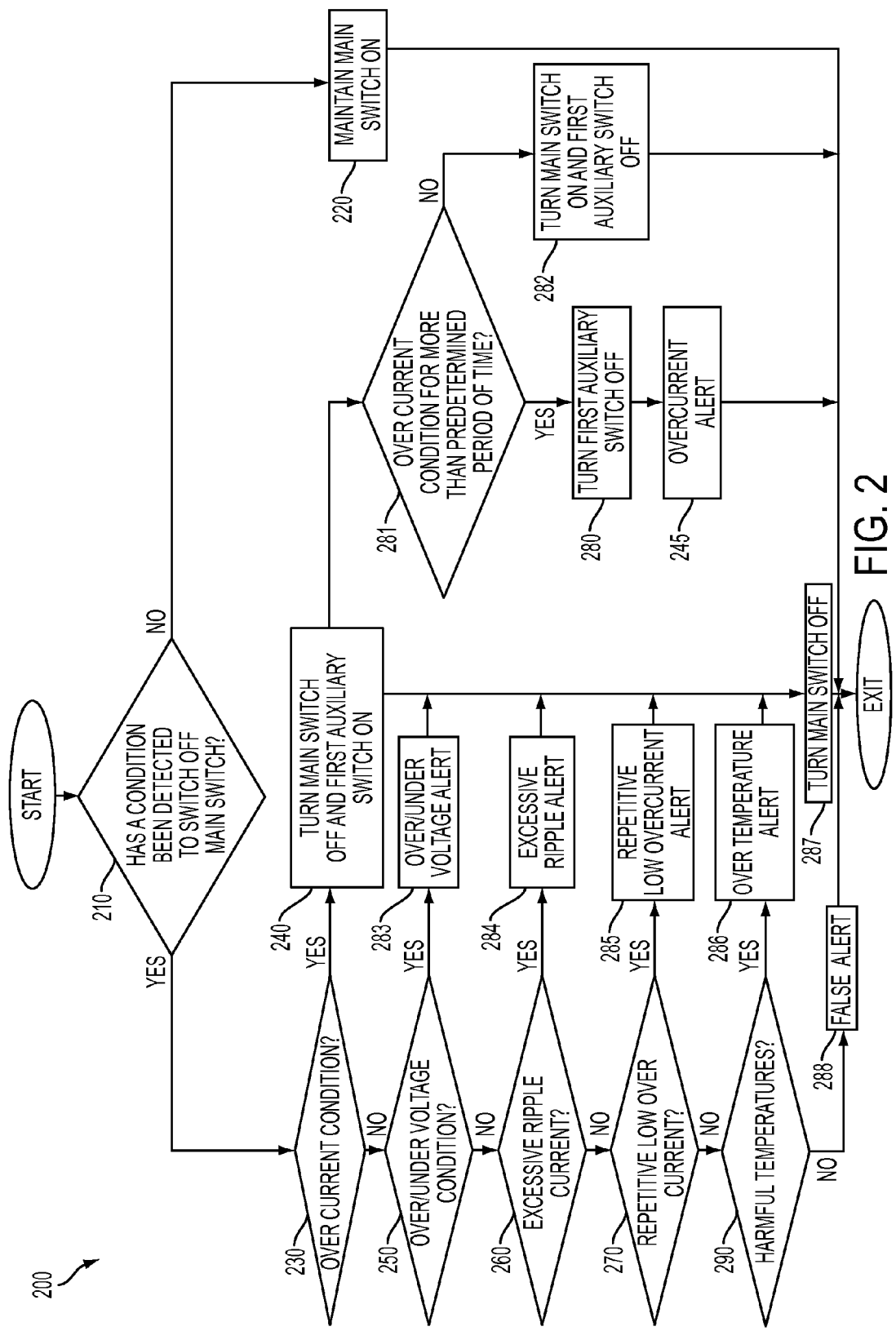
FIG. 2 illustrates a flowchart for a protective function method.

FIG. 2 illustrates a flowchart for a protective function method 200. As described herein, the SSPC 101 can detect and address several conditions and the on/off-current limit controller 135 can provide several protective functions to the main switch 105. The method 200 can cycle continuously to detect the various conditions and to take the necessary action as described herein. At block 210, the on/off-current limit controller 135 determines if there are any conditions that require turning off the main switch 105. If there are no conditions to turn off the main switch 105 at block 210, then the main switch 105 remains on as indicated at block 220. If there are conditions to turn the main switch 105 off, then at block 230 the on/off-current limit controller 135 determines if the condition is an over current condition. If the condition is an over current condition, at block 230 the on/off-current limit controller 135 switches the main switch 105 off and turns on the first auxiliary switch 110 as indicated at block 240. If the overcurrent condition exists for more than predetermined period of time at block 281, then the on/off-current limit controller 135 turns the first auxiliary switch off at block 280 and issues an overcurrent alert at block 245, then exits. If the overcurrent condition does not exceed predetermined period of time at block 281, then the on/off-current limit controller 135 turns the main switch on and turns the first auxiliary switch off at block 282, then exits. If the condition is not an over current condition at block 230, then the on/off-current limit controller 135 and the pre-charge controller 170 determine if the condition is an over/under voltage condition at block 250. The pre-charge controller 135 mainly controls the second auxiliary switch 115 during power up as described herein. However, the pre-charge controller 135 can also sense under/over voltage conditions during operation of the system 100 and can report those conditions to the on/off-current limit controller 135. If there is an over/under voltage condition at block 250, the on/off-current limit controller 135, generates an over/under voltage alert at block 283, turns off the main switch 105 at block 287, and exits. If there is not an over/under voltage condition at block 250, the on/off-current limit controller 135 determines if there is an excessive ripple current at block 260. If there is an excessive ripple current at block 260, the on/off-current limit controller 135, issues an excessive ripple alert at block 284, turns the main switch 105 off at block 287 and exits. If there was not an excessive ripple current at block 260, the on/off-current limit controller 135 determines if there is repetitive low over current at block 270. If there is repetitive low over current at block 270, the on/off-current limit controller 135, issues a repetitive low overcurrent alert at block 285, switches the main switch 105 off at block 287 and exits. If there was not repetitive low over current at block 270, the on/off-current limit controller 135 determines if there are harmful temperatures at block 290. If there are harmful temperatures at block 290, the on/off-current limit controller 135, issues an over temperature alert at block 286, switches the main switch 105 off at block 287 and exits. If there are no harmful temperatures at block 290, the on/off-current limit controller 135 issues a false alert at block 288, and then exits. As described herein, the process can repeat itself so that the SSPC 101 can constantly monitor itself.

The switches described herein can be any suitable switch that meets the operating criteria. For example, the main switch 105 can be a Silicon Carbide Metal On Oxide Field Effect Transistor (SiC MOSFET), and the first, second and third auxiliary switches 110, 115, 120 can be a Silicon insulated gate bipolar transistor (Si IGBT).

The on/off-current-limit controller 135, pre-charge controller 170 and active damper controller 180 can be any suitable microcontroller or microprocessor for executing the instructions (e.g., on/off commands) described herein. As such, the suitable microcontroller or microprocessor can be any custom made or commercially available processor, a central processing unit (CPU), an auxiliary processor among several processors, a semiconductor based microprocessor (in the form of a microchip or chip set), a macroprocessor, or generally any device for executing software instructions.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In exemplary embodiments, where the methods are implemented in hardware, the methods described herein can implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects include the improvement of a system by use of linear current limiting and well as the reduction of bus ripple due to an open loop unstable load. The systems and methods described herein further reduce system weight, size, and cost by eliminating passive dampers and a DC link pre-charge circuit from the switching mode power converter (i.e., constant power load 160).

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A solid state power controller (SSPC) apparatus, comprising:
    an on/off-current limit controller;
    a pre-charge controller coupled to the on/off-current limit controller;
    an active damper controller coupled to the on/off-current limit controller;
    a main switch coupled to and responsive to on/off and protective commands from the on/off-current limit controller; and
    a first auxiliary switch coupled to the active damper controller; and
    a damping resistor coupled to the third auxiliary switch.

2. The apparatus as claimed in claim 1 further comprising:
    a second auxiliary switch coupled to the on/off-current limit controller; and
    a current limiting resistor coupled to the first auxiliary switch.

3. The apparatus as claimed in claim 1 further comprising:
    a third auxiliary switch coupled to the pre-charge controller; and
    a pre-charge resistor coupled to the second auxiliary switch.

4. The apparatus as claimed in claim 3 further comprising a voltage sensor disposed between the pre-charge controller and the pre-charge resistor.

5. The apparatus as claimed in claim 4 wherein the voltage sensor is configured to detect over/under voltage conditions.

6. The apparatus as claimed in claim 1 wherein the active damper controller is configured to turn the third auxiliary switch on and off.

7. The apparatus as claimed in claim 1 further comprising a SSPC current sensor coupled to the on/off-current limit controller and to the main switch and configured to detect an over-current condition.

8. The apparatus as claimed in claim 7 wherein the SSPC current sensor is further configured to detect a repetitive low over-current condition.

9. A solid state power controller (SSPC) system, comprising:
    a SSPC apparatus, including:
        an on/off-current limit controller;
        a pre-charge controller coupled to the on/off-current limit controller;
        an active damper controller coupled to the on/off-current limit controller;

a main switch coupled to and responsive to on/off and protective commands from the on/off-current limit controller;

a first auxiliary switch coupled to the active damper controller; and a damping resistor coupled to the third auxiliary switch;

a direct current (DC) power source coupled to the SSPC apparatus;

a constant power load; and an input filter disposed between the constant power load and the SSPC apparatus.

10. The system as claimed in claim 9 further comprising:

a second auxiliary switch coupled to the on/off-current limit controller; and a current limiting resistor coupled to the first auxiliary switch.

11. The system as claimed in claim 9 further comprising:

a third auxiliary switch coupled to the pre-charge controller; and a pre-charge resistor coupled to the second auxiliary switch.

12. The system as claimed in claim 11 further comprising a voltage sensor disposed between the pre-charge controller and the pre-charge resistor.

13. The apparatus as claimed in claim 12 wherein the voltage sensor is configured to detect over/under voltage conditions.

14. The apparatus as claimed in claim 9 wherein the active damper controller is configured to turn the third auxiliary switch on and off.

15. The system as claimed in claim 9 further comprising a first current sensor coupled to the on/off-current limit controller and to the main switch and configured to detect and over-current condition.

16. The apparatus as claimed in claim 9 wherein the first current sensor is further configured to detect a repetitive low over-current condition.

17. The apparatus as claimed in claim 9 further comprising a second current sensor disposed in the input filter and coupled to the active damper controller.

* * * * *